US010935658B2

(12) United States Patent
Park et al.

(10) Patent No.: US 10,935,658 B2
(45) Date of Patent: Mar. 2, 2021

(54) LIDAR SENSOR FOR VEHICLES AND METHOD OF OPERATING THE SAME

(71) Applicants: INDUSTRY-ACADEMIC COOPERATION FOUNDATION, YONSEI UNIVERSITY, Seoul (KR); UNIST (Ulsan National Institute of Science and Technology), Ulsan (KR)

(72) Inventors: Seung Han Park, Seoul (KR); Young Cheol Chae, Seoul (KR); Seong Jin Kim, Ulsan (KR)

(73) Assignees: INDUSTRY-ACADEMIC COOPERATION FOUNDATION, YONSEI UNIVERSITY, Seoul (KR); UNIST (Ulsan National Institute of Science and Technology), Ulsan (KR)

( * ) Notice: Subject to any disclaimer, the term of this patent is extended or adjusted under 35 U.S.C. 154(b) by 335 days.

(21) Appl. No.: 15/963,705

(22) Filed: Apr. 26, 2018

(65) Prior Publication Data

US 2019/0086540 A1 Mar. 21, 2019

(30) Foreign Application Priority Data

Sep. 20, 2017 (KR) ........................ 10-2017-0121038

(51) Int. Cl.
*G01S 17/08* (2006.01)
*G01S 17/89* (2020.01)
*H01L 27/146* (2006.01)
*G01S 17/10* (2020.01)
*G01S 7/4863* (2020.01)
(Continued)

(52) U.S. Cl.
CPC ............ *G01S 17/08* (2013.01); *G01S 7/4863* (2013.01); *G01S 7/4865* (2013.01); *G01S 7/497* (2013.01); *G01S 17/10* (2013.01); *G01S 17/18* (2020.01); *G01S 17/87* (2013.01); *G01S 17/89* (2013.01); *H01L 27/14643* (2013.01); *G01S 17/931* (2020.01)

(58) Field of Classification Search
CPC ........ G01S 17/10; G01S 7/4865; G01S 17/36; G01S 7/484; G01S 7/4815
See application file for complete search history.

(56) References Cited

U.S. PATENT DOCUMENTS

2016/0274237 A1* 9/2016 Stutz ...................... G01S 17/10
2017/0052065 A1 2/2017 Sharma et al.

FOREIGN PATENT DOCUMENTS

JP 2010127839 A 6/2010
JP 2014119428 A 6/2014
(Continued)

OTHER PUBLICATIONS

Communication dated Nov. 23, 2018, issued by the European Patent Office in counterpart European Patent Application No. 18170086.5.

*Primary Examiner* — Luke D Ratcliffe
(74) *Attorney, Agent, or Firm* — Sughrue Mion, PLLC

(57) ABSTRACT

Disclosed are a lidar sensor for vehicles and a method of operating the same. In accordance with an embodiment of the present disclosure, the lidar sensor may include a first sensor configured to measure a distance to a target; and a second sensor configured to control output of a transmission signal considering the measured distance and measure a front including the target using the controlled transmission signal in high resolution.

7 Claims, 9 Drawing Sheets

(51) Int. Cl.
  *G01S 7/4865* (2020.01)
  *G01S 17/87* (2020.01)
  *G01S 7/497* (2006.01)
  *G01S 17/18* (2020.01)
  G01S 17/931 (2020.01)

(56) References Cited

FOREIGN PATENT DOCUMENTS

| KR | 10-2004-0102182 A | 12/2004 |
| KR | 10-2010-0011676 A | 2/2010 |
| KR | 10-2014-0144611 A | 12/2014 |
| KR | 10-2016-0142839 A | 12/2016 |
| WO | 2008/152647 A2 | 12/2008 |

* cited by examiner

LIDAR SENSOR FOR VEHICLES AND METHOD OF OPERATING THE SAME

CROSS-REFERENCE TO RELATED APPLICATION

This application claims the priority benefit of Korean Patent Application No. 10-2017-0121038, filed on Sep. 20, 2017 in the Korean Intellectual Property Office, the disclosure of which is incorporated herein by reference.

BACKGROUND OF THE DISCLOSURE

Field of the Disclosure

The present disclosure relates to a lidar sensor for vehicles and a method of operating the same, particularly to a technical idea of first measuring a rough distance value to a target in a direct manner and precisely measuring an exact value of the measured rough distance value based on the measured rough distance value.

Description of the Related Art

A lidar sensor, which adopts a technique of measuring a distance using light, can be interpreted as the same as a laser radar.

A laser radar can be considered as a radar developed by using a laser beam with properties similar to those of radio waves. Although lasers were originally developed for communication, lasers have been used for various purposes besides communication because lasers have both light and radio wave characteristics due to strong monochromaticity thereof.

In particular, it is possible to measure distance because the speed of light is constant. Specifically, distance can be precisely measured by accurately measuring the time that light from the light source near a camera reflects back to the object, which is called Time-of-Flight (TOF) technology.

TOF technology is broadly divided into two manners, i.e., a direct manner and an indirect manner.

The direct manner is a manner of directly measuring the time between when pulse-type light is irradiated and when reflected light is received. Here, given the speed of light, accuracy can be improved when a pulse width is minimized.

In addition, measured time is so short, i.e. a distance of 100 m is calculated as a TOF of 667 ns, that a precise time-to-digital converter should be required and the sensitivity of a light receiving element should be very high. To reduce the uncertainty in the depth measurement, a light receiving element of a sensor used in general cameras measures received light for a long time of about 30 ms and the most reliable TOF value is chosen by digital processing such as histogramming.

Accordingly, in a direct manner, an Avalanche Photodiode (APD) or a Single Photon Avalanche Diode (SPAD) may be used as a light receiving element.

An SPAD can respond even upon receiving a single photon, as the name implies, and send a digital pulse. This method is advantageous in that it is theoretically possible to measure a long distance because there is no restriction on distance and resistance to external light, such as sunlight, is high due to a wide dynamic range of an element.

However, since an SPAD is larger than a general photodiode and requires a large memory to digitize and store the time between the pulse of the light irradiated by data and the SPAD reaction output pulse, there are difficulties in realizing a high spatial resolution.

On the other hand, a lidar sensor used in vehicles should have high resolution in that all images at the front side of a vehicle are obtained. Recently, various technologies have been developed to improve the resolution of a lidar sensor for vehicles. Lidar sensors under development or commercialized require a driver to rotate a sensor to improve resolution. However, when the driver for rotating the sensor is mounted on a vehicle, it is easily affected by vibration and thus it is difficult to obtain a reliable result.

An indirect manner is a manner of calculating distance by measuring a phase difference between light irradiated after modulation and the reflected light and without directly measuring the time.

Accordingly, a digital converter for time measurement is not necessary and, since all time data for light pulses irradiated is not stored, memory is not necessary. Accordingly, a lidar sensor adopting this manner is smaller than that adopting a direct manner. Therefore, it is possible to increase spatial resolution. Nevertheless, the in-direct manner is only capable of measuring a distance corresponding to the period of a modulated wave, and has a limit of being vulnerable to external light.

RELATED ART DOCUMENTS

Patent Documents

Korean Patent Application Publication No. 2010-0011676, entitled "IMAGE SENSOR AND OPERATING METHOD FOR IMAGE SENSOR"

Korean Patent Application Publication No. 2016-0142839, entitled "HIGH RESOLUTION, HIGH FRAME RATE, LOW POWER IMAGE SENSOR"

SUMMARY OF THE DISCLOSURE

Therefore, the present invention has been made in view of the above problems, and it is one object of the present invention to provide an ideal lidar sensor configured to measure a rough distance in a direct manner and measure a wide viewing angle (spatial resolution) in an indirect manner.

It is another object of the present invention to obtain a high-resolution distance image at a front side of a vehicle using light.

It is another object of the present invention to obtain a high-resolution distance image using a small storage space.

It is another object of the present invention to increase reliability of a distance image by reducing influence due to vibration of a vehicle.

It is yet another object of the present invention to address vulnerability to external light.

In accordance with an aspect of the present invention, the above and other objects can be accomplished by the provision of a lidar sensor including a first sensor configured to measure a distance to a target; and a second sensor configured to control output of a transmission signal considering the measured distance and measure a front including the target using the controlled transmission signal in high resolution.

The first sensor according to an embodiment of the present disclosure may measure a time until pulse-type light irradiated to the target is reflected by the target and is returned to measure the distance.

The first sensor according to an embodiment of the present disclosure may include at least one light receiving element of an Avalanche Photodiode (APD) and a Single Photon Avalanche Diode (SPAD).

The second sensor according to an embodiment of the present disclosure may measure a phase difference between the pulse-type light irradiated to the front and the light reflected and returned after the irradiation to measure the front in high resolution.

The second sensor according to an embodiment of the present disclosure may measure the front at a reference interval within a threshold range based on the measured distance.

In accordance with another aspect of the present invention, there is provided a lidar sensor including a first pixel configured to measure a distance to a target; a controller configured to control output of a transmission signal considering the measured distance; and a plurality of second pixels configured to measure a front including the target in high resolution using the controlled transmission signal.

The lidar sensor according to an embodiment of the present disclosure may further include a calculator configured to calculate sensing data by interpolating the distance measured by the first pixel and a distance measured by the second pixels 320.

The second pixels according to an embodiment of the present disclosure may measure the front at a reference interval within a threshold range based on the measured distance.

The second pixels according to an embodiment of the present disclosure may include a drain node, and the controller may turn on the drain node to remove electrons generated by external light when the transmission signal is not turned on by the external light.

In accordance with yet another aspect of the present invention there is provided a method of operating a lidar sensor, the method including measuring a distance to a target; controlling output of a transmission signal considering the measured distance; and measuring a front including the target in high resolution using the controlled transmission signal.

The measuring of the distance to the target according to an embodiment of the present disclosure may include measuring a time until pulse-type light irradiated to the target is reflected by the target and is returned; and measuring the distance based on the measured time.

The measuring of the front according to an embodiment of the present disclosure may include measuring a phase difference between pulse-type light irradiated to the front and light reflected and returned after the irradiation; and measuring the front in high resolution based on the measured phase difference.

The measuring of the front according to an embodiment of the present disclosure may include measuring the front at a reference interval within a threshold range based on the measured distance.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
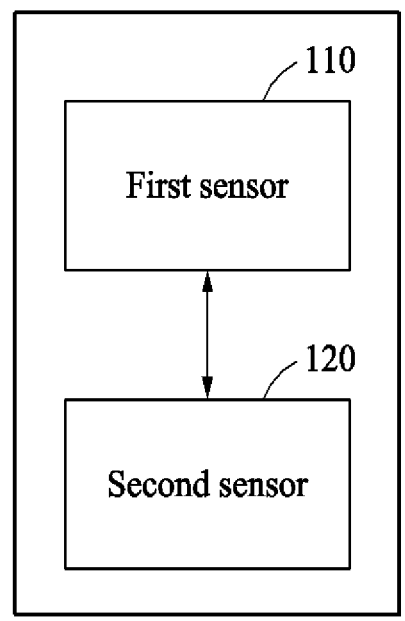
FIG. 1 is a view illustrating a lidar sensor according to an embodiment of the present disclosure.

Specific structural or functional descriptions of embodiments according to the concepts of the present invention disclosed herein are illustrated for the purpose of describing embodiments only in accordance with the concepts of the present invention, and the embodiments according to the concepts may be implemented in various forms and the scope of the present invention is not limited to the embodiments described herein.

Embodiments in accordance with the concepts of the present invention are capable of various modifications and may take various forms, so that the embodiments are illustrated in the drawings and described in detail herein. It should be understood, however, that the intention is not to limit the embodiments according to the concepts of the present invention to the specific disclosed embodiments, but includes changes, equivalents, or alternatives falling within the spirit and scope of the present invention.

It will be understood that, although the terms first, second, third etc. may be used herein to describe various components, these components should not be limited by these terms. These terms are only used to distinguish one component from another component. For example, a first element may be termed a second element and a second element may be termed a first element without departing from the teachings of the present invention.

It will be understood that when an element, such as a layer, a region, or a substrate, is referred to as being "on", "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention will now be described more fully with reference to the accompanying drawings, in which exemplary embodiments of the invention are shown. This invention may, however, be embodied in many different forms and should not be construed as limited to the exemplary embodiments set forth herein. Like reference numerals in the drawings denote like elements.

FIG. 1 is a view illustrating a lidar sensor 100 according to an embodiment of the present disclosure.

The lidar sensor 100 according to an embodiment of the present disclosure aims to obtain a high-resolution distance image at a front side of a vehicle using light.

To accomplish this, the lidar sensor 100 according to an embodiment of the present disclosure roughly measures a distance in a direct manner, and then precisely measures a wide viewing angle (spatial resolution) in an indirect manner. Accordingly, an ideal lidar sensor may be realized.

In particular, the lidar sensor 100 according to an embodiment of the present disclosure may include a first sensor 110 and a second sensor 120.

The first sensor 110 according to an embodiment of the present disclosure roughly measures a distance to a target, and the second sensor 120 may control output of a transmission signal considering the measured distance and may measure a front including the target in high resolution using the controlled transmission signal.

To accomplish this, the first sensor 110 may measure distance in a direct manner. In particular, the first sensor 110 may measure a distance by irradiating a target with pulse-type light and measuring a time until the irradiated light is reflected by the target and returns.

In the case of a direct manner, accuracy increases as pulse width decreases, considering a speed of light. In addition, measured time is so short, i.e. a distance of 100 m is calculated as a TOF of 667 ns, that a precise time-to-digital converter should be required and the sensitivity of a light receiving element used in the first sensor 110 should be much higher than a standard value. Accordingly, the first sensor 110 may include at least one light receiving element of an Avalanche Photodiode (APD) and a Single Photon Avalanche Diode (SPAD).

An SPAD may sense even a single photon, as the name implies, and send a digital pulse. In addition, the SPAD may measure a long distance due to small restriction on distance and is less affected by external light, such as sunlight, due to a wide dynamic range thereof.

Meanwhile, the second sensor 120 may measure a front in high resolution using an indirect manner. That is, the front may be measured at high resolution by measuring a phase difference between pulse-type light irradiated to the front and light reflected and returned after the irradiation, within a threshold range, based on the distance roughly measured by the first sensor 110.

The second sensor 120 may measure distance by irradiating light after modulating the same, and then measuring a phase difference between the irradiated light and reflected light, without directly measuring time.

Accordingly, the second sensor 120 does not require a digital converter for time measurement. In addition, the second sensor 120 does not require a separate memory because all time data for irradiated light pulses is not stored. That is, by using the second sensor 120, spatial resolution may be increased while using less system resources.

The second sensor 120 according to an embodiment of the present disclosure may measure the front at a reference interval within a threshold range based on the measured distance.

The lidar sensor 100 according to an embodiment of the present disclosure may further include a controller (not shown) configured to control at least one of an order, ratios, and operations of the distance (coarse) measured using the first sensor 110 and the distance (fine) measured using the second sensor 120 through a software.

For example, the controller according to an embodiment of the present disclosure may perform control such that a frame (assumed to be a D frame) measured in a direct manner and a frame (assumed to be an I frame) measured in an indirect manner are measured according to frame types. Here, the measurement may be performed in order of D frame, I frame, D frame, and I frame.

Subsequently, the controller may measure a distance of each of the measured frames using software.

Figure 2A:
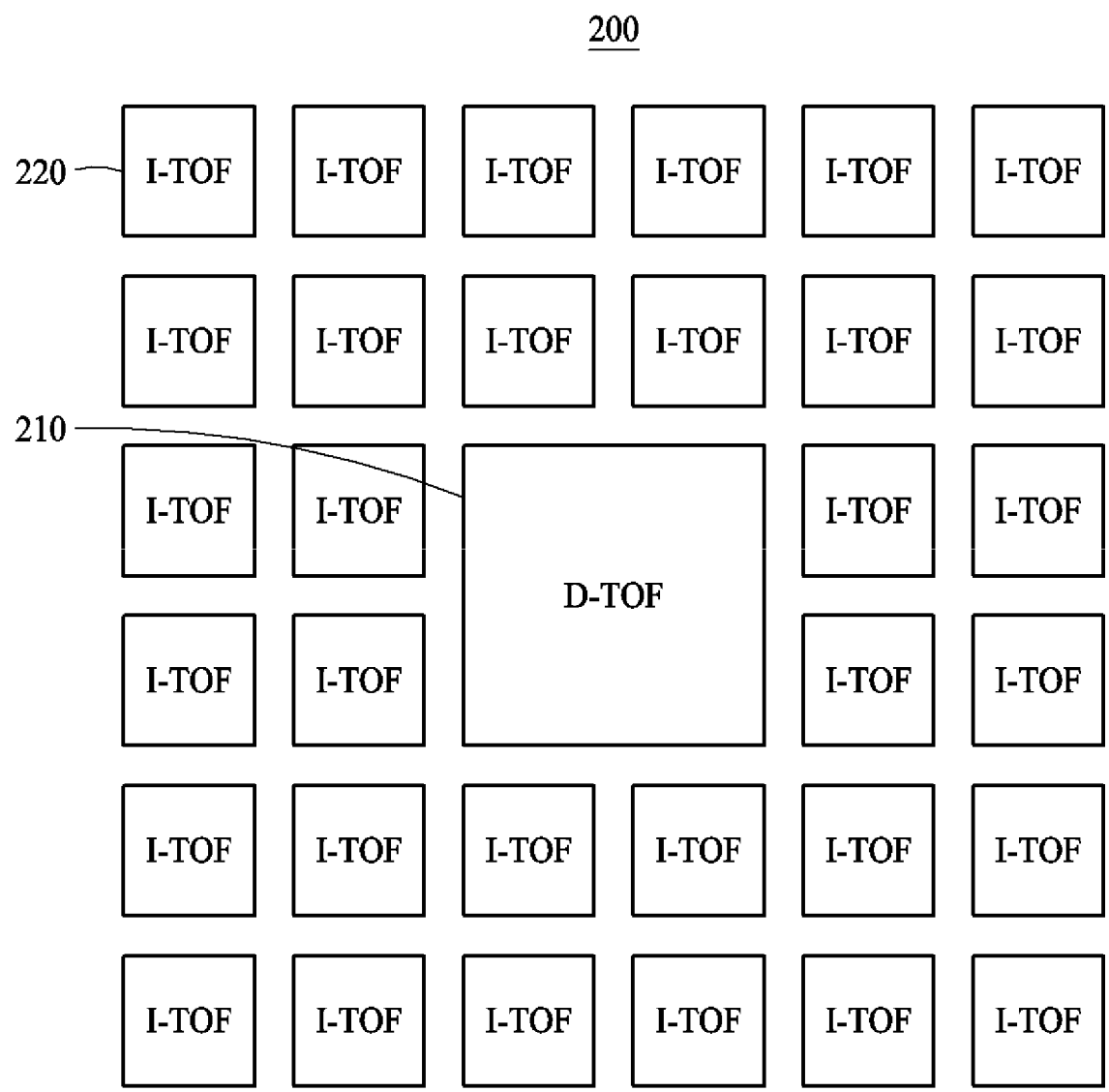
FIG. 2A is a view particularly illustrating a structure of a lidar sensor wherein second sensors adopting an indirect manner are disposed around a first sensor adopting a direct manner.

FIG. 2A is a view particularly illustrating a structure of a lidar sensor 200 wherein second sensors 220 adopting an indirect manner are disposed around a first sensor 210 adopting a direct manner.

The first sensor 210 may first measure a rough distance to a target.

The second sensors 220 may be disposed around the first sensor 210 and may measure a front including a target in high resolution using a transmission signal controlled according to the distance measured by the first sensor 210. Here, the first sensor 210 may generate a control signal such that the second sensors 220 may control output of the transmission signal. To accomplish this, a controller of the first sensor 210 generates a control signal corresponding to the measured distance and transmits the generated control signal to the second sensors 220 around the first sensor 210 such that the output of the transmission signal may be controlled.

A ratio of the number of the second sensors to the number of the first sensor is 5 to 20.

Figure 2B:
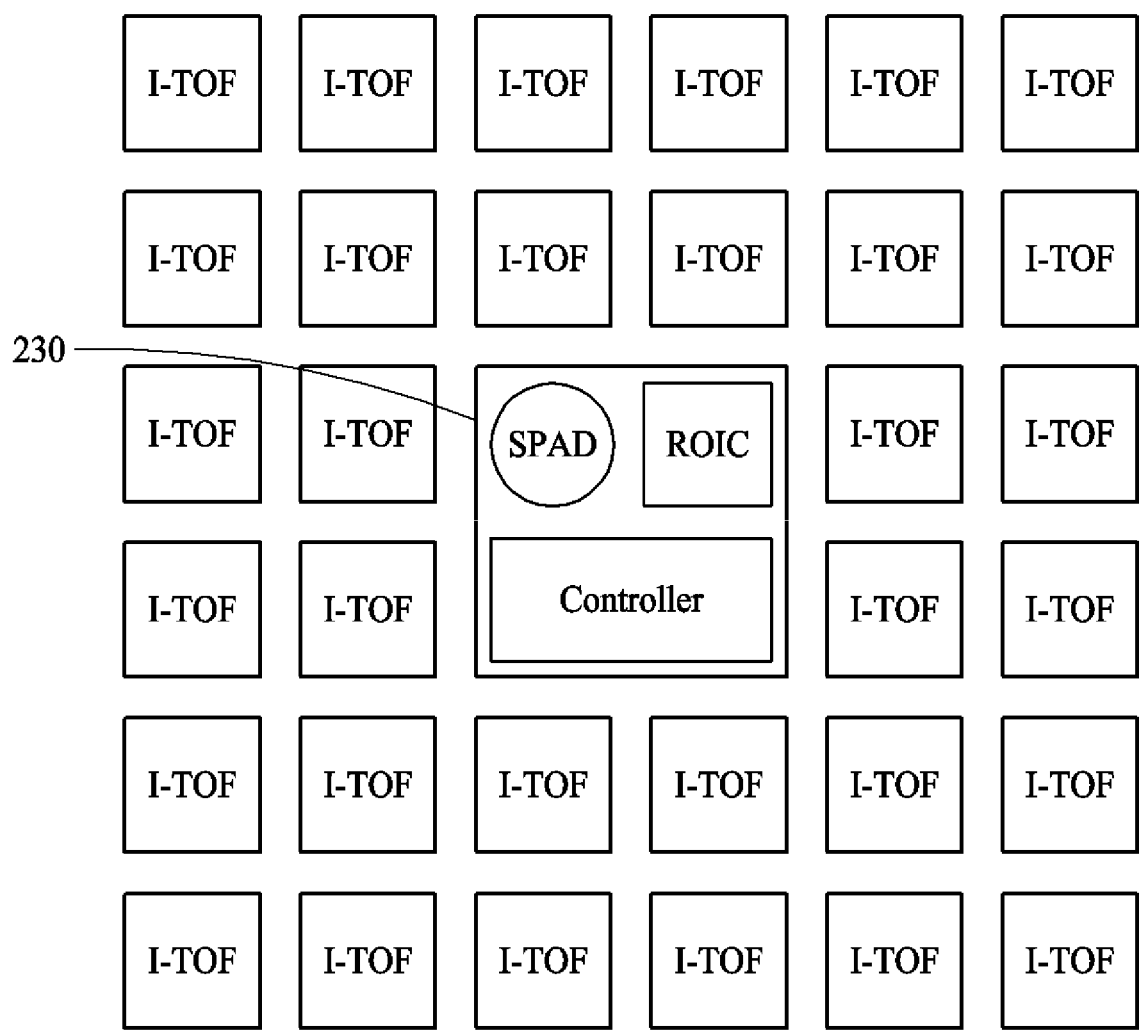
FIG. 2B is a view more particularly illustrating a first sensor adopting a direct manner.

FIG. 2B is a view more particularly illustrating a first sensor 230 adopting a direct manner.

The first sensor 230 adopting a direct manner may include an SPAD, an ROIC, and a controller.

The first sensor 230 may include at least one light receiving element of an Avalanche Photodiode (APD) and a Single Photon Avalanche Diode (SPAD).

An SPAD may respond even upon receiving a single photon and send a digital pulse. In addition, the SPAD may measure a long distance due to small restriction on a distance and is less affected by external light, such as sunlight, due to a wide dynamic range thereof.

A ReadOut Integrated Circuit (ROIC) may be interpreted as an electrical multiplexer used to electrically interface with a hybrid flat array in a detector array. In addition, the ROIC includes an array of pixel circuits (single cells) capable of applying a reference voltage to each detector or measuring signals generated by incident electromagnetic energy. In addition, the ROIC may transmit signals recorded in a buffer to an external electronic circuit, or act as a photosensor and an infrared detector sensitive to ultraviolet.

Figure 2C:
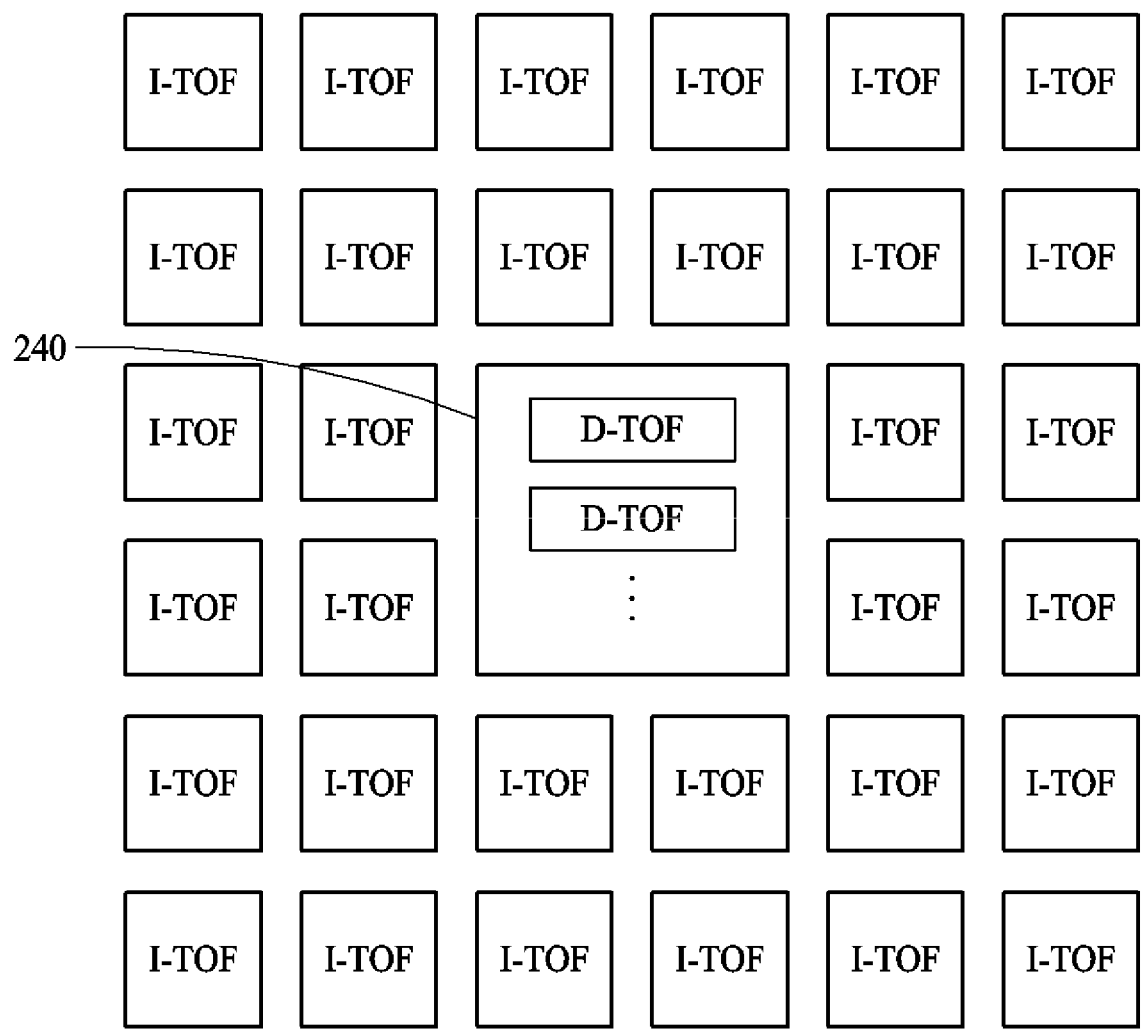
FIG. 2C is a view illustrating an embodiment of realizing a plurality of first sensors adopting a direct manner.

FIG. 2C is a view illustrating an embodiment of realizing a plurality of first sensors adopting a direct manner.

More particularly, as indicated by reference number 240, two, four, or more D-TOFs may be disposed in a local pixel group to improve spatial resolution. That is, a plurality of D-TOFs may be disposed in one local pixel group.

Figure 3:
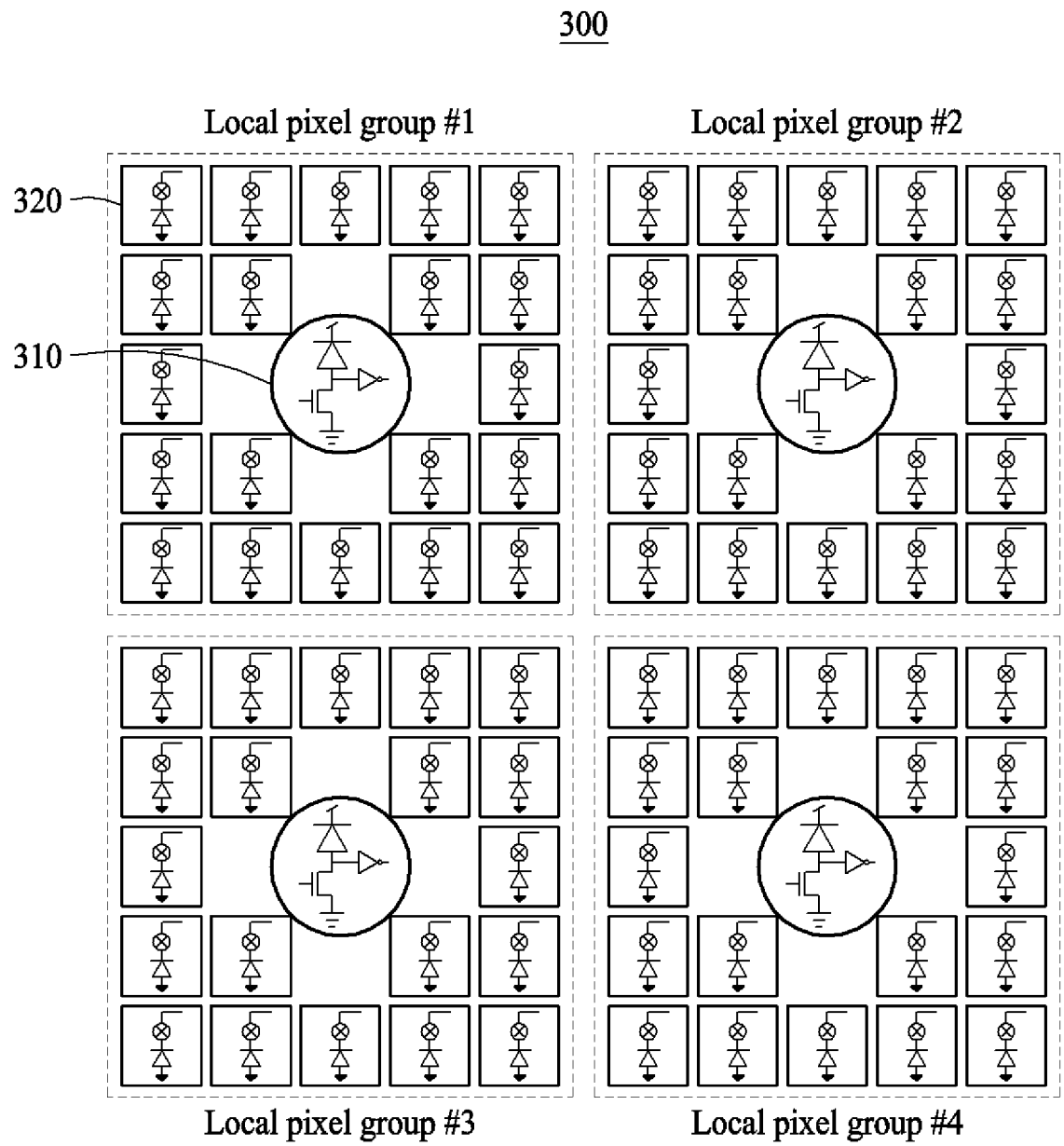
FIG. 3 is a view illustrating a lidar sensor formed of a plurality of pixel groups.

FIG. 3 is a view illustrating a lidar sensor 300 formed of a plurality of pixel groups.

Each pixel group of the lidar sensor 300 according to an embodiment of the present disclosure may include a first pixel 310 measuring a distance to a target; and a plurality of second pixels 320 disposed around the first pixels and measuring a front including a target in high resolution using a controlled transmission signal. In addition, the lidar sensor 300 may further include a controller (not shown) configured to control output of a transmission signal considering the measured distance. Further, the lidar sensor 300 may further include a calculator (not shown) configured to calculate sensing data by interpolating a distance measured by the first pixel 310 and a distance measured by the second pixels 320.

For example, the first pixel 310 may be interpreted as an SPAD-type pixel, and the second pixels 320 may be interpreted as lock-in pixels.

A manner of arranging the SPAD-type pixel and the lock-in pixels may be varied. Preferably, the lock-in pixels are disposed around the SPAD pixel.

Each group is formed of the central SPAD pixel, and the lock-in pixels in a predetermined region. The groups may respectively be represented by local pixel groups #1 to #4.

Since, in the case of general images, many signals are present in low frequency bands, distances close to each other are very likely to have a similar value.

The lidar sensor 300 may be realized as a coarse-fine 2-step distance measurement structure wherein a rough distance value is first measured as a representative of surrounding pixels in a group through the SPAD pixel and an exact value of the distance value measured by the SPAD is precisely measured using the surrounding lock-in pixels.

For example, the second pixels 320 may measure the front at the reference interval within a threshold range based on the measured distance. Hereinafter, the present disclosure is described in more detail with reference to FIG. 4.

Figure 4:
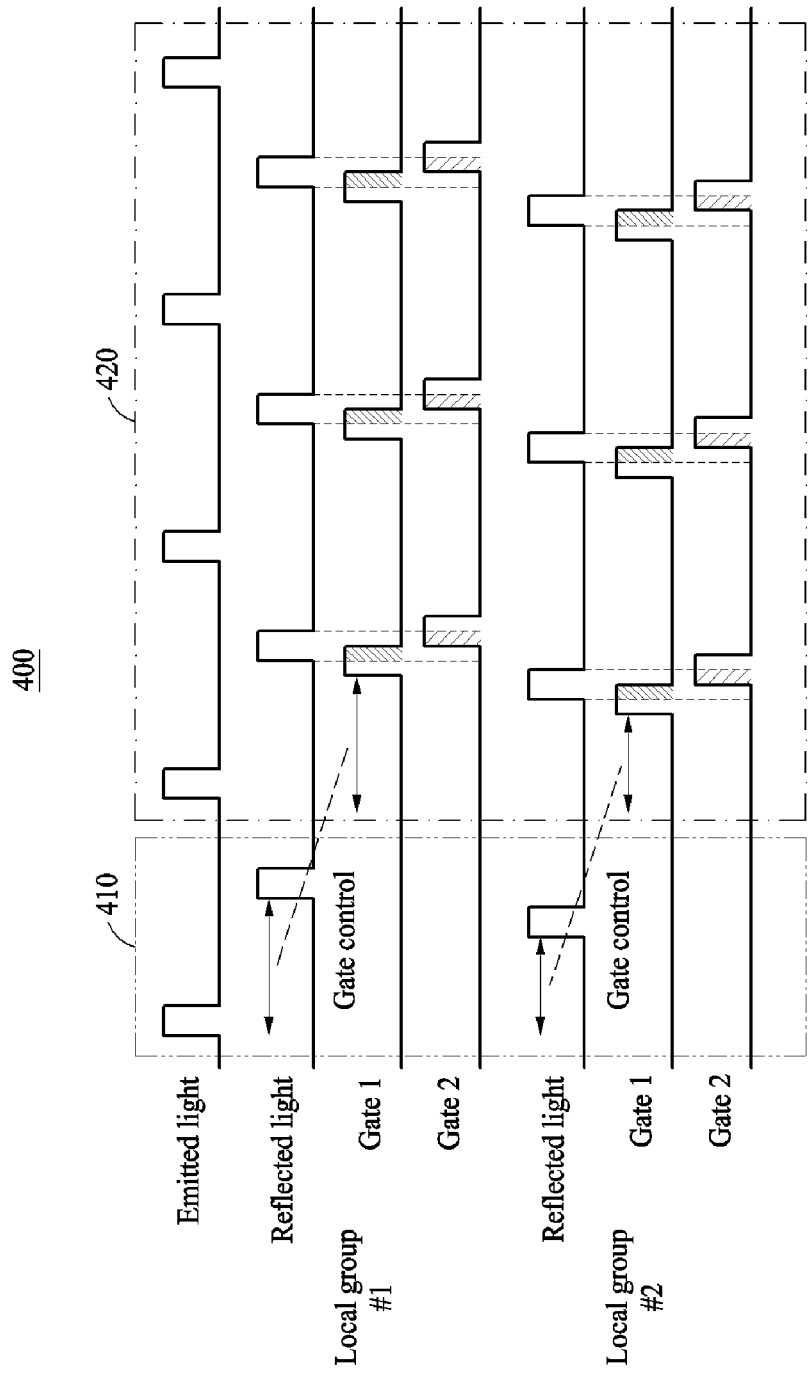
FIG. 4 is a timing diagram illustrating operation of a pixel structure according to an embodiment of the present disclosure.

FIG. 4 is a timing diagram 400 illustrating operation of a pixel structure according to an embodiment of the present disclosure.

Referring to the timing diagram 400, an SPAD of each local pixel group measures a rough distance though a portion corresponding to reference numeral 410, and a particular distance may be measured by control (gate control) a transmission signal to correspond to the measured distance through reference numeral 420 and applying to surrounding lock-in pixels.

An SPAD pixel value may be obtained by interpolating the rough distance value and the distance value from the surrounding lock-in pixels.

In accordance with the timing diagram 400, the lock-in pixels only detect distances in a pulse period, thus increasing efficiency.

For example, when a total detection distance is 50 m, a rough distance value is first calculated at an interval of 1 m in an SPAD, and then local pixel group #1 may output 20 m and local pixel group #2 may output 25 m.

Subsequently, lock-in pixels of local pixel group #1 measure a distance of 5 m at an interval of 5 cm around 20 m, and may calculate a distance of 17.5 m to 22.5 m at an interval of 5 cm from the two values.

In addition, lock-in pixels of local pixel group #2 measure a distance of 5 m at an interval of 5 cm around 25 m, and may calculate a distance of 22.5 m to 27.5 m at an interval of 5 cm from the two values.

Figure 5:
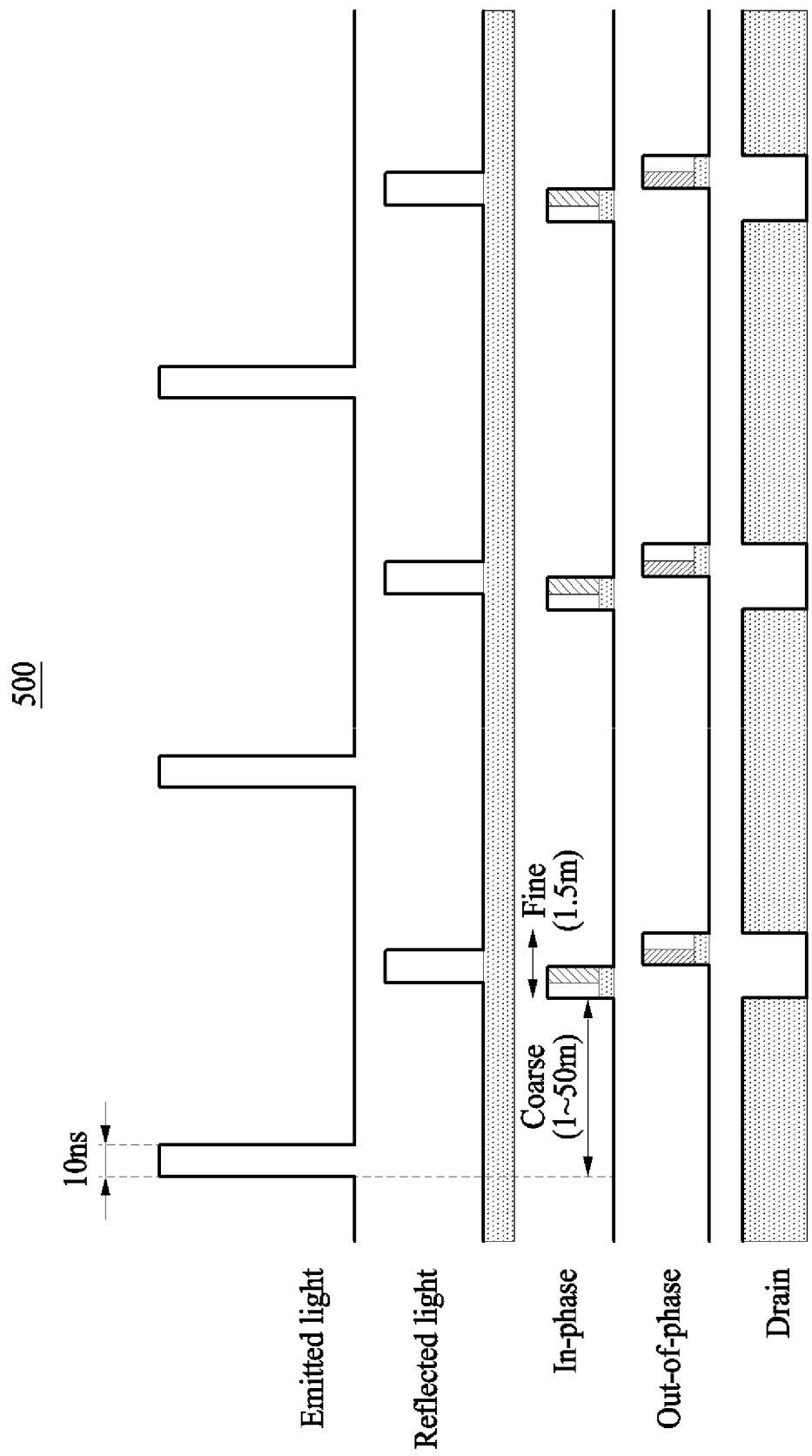
FIG. 5 is a timing diagram illustrating in-phase and an out-of-phase operation so as to suppress external light according to an embodiment of the present disclosure.

FIG. 5 is a timing diagram 500 illustrating in-phase and an out-of-phase operation so as to suppress external light according to an embodiment of the present disclosure.

Second pixels include a drain node, and a controller may turn on the drain node to remove electrons generated by external light when a transmission signal is not turned on by external light.

In accordance with an embodiment of the present disclosure, vulnerability to external light, as a drawback of a lock-in pixel, may be improved.

The in-phase and the out-of-phase of FIG. 5 may correspond to gates 1 and 2 of FIG. 4.

The lock-in pixel is vulnerable to external light because a pulse wavelength of light reflected and returned is very short, but sunlight is continuously incident on the pixel, generating electrons.

However, the lidar sensor according to the present disclosure may add a drain node to the lock-in pixels and, when a transmission signal is not turned on (when the in-phase or the out-of-phase is 0), may turn on a signal by a drain node to remove electrons generated by external light.

For example, to measure a distance of about 50 m, a light pulse is irradiated once every 333 ns, and external light is incident on the light receiving element for 333 ns.

Here, when a pulse wavelength of irradiated light is 10 ns, reflected light has a pulse of 10 ns, so that the ratio of external light incidence time to reflected light incidence time is 333:10.

However, according to the present disclosure, an incidence time of external light may be reduced to 20 ns using the drain node, so that the ratio of external light incidence time to reflected light incidence time is 20:10. Accordingly, a 15 times higher external light removal effect may be provided.

In addition, since a pulse of irradiated light is short, an average intensity is not greatly affected although intensity of light is increased. Accordingly, eye safety is not affected.

Theoretically, when a pulse is short, a distance that the lock-in pixels detect is small. However, the pulse width may be adjusted according to situation because there is a trade-off relationship between the maximum distance and the accuracy.

Figure 6:
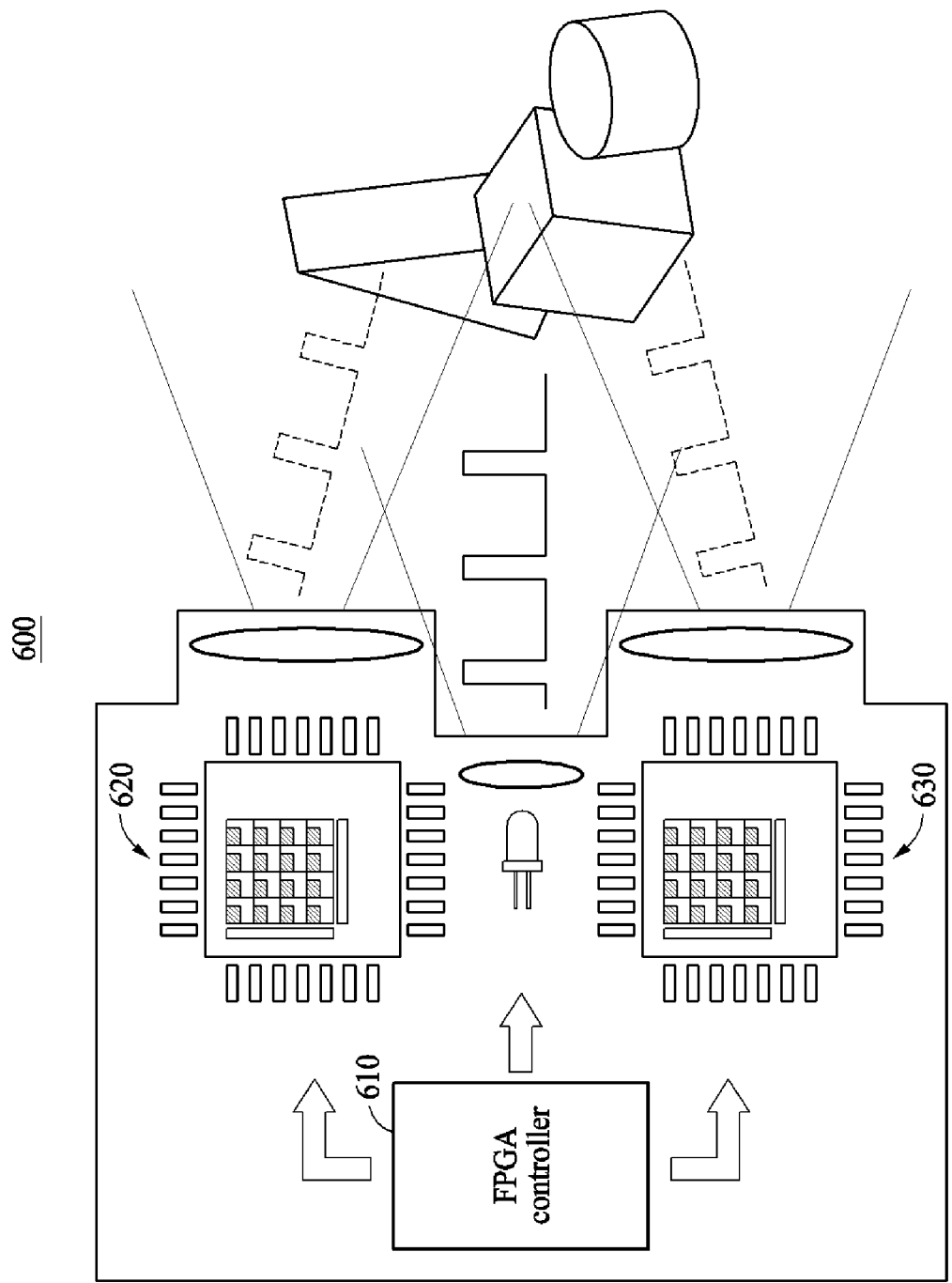
FIG. 6 is a view illustrating an embodiment of using two or more sensors so as to provide a viewing angle required in a lidar sensor for vehicles.

FIG. 6 is a view illustrating an embodiment of using two or more sensors so as to provide a viewing angle required in a lidar sensor for vehicles.

To provide a wide viewing angle required in a lidar sensor for vehicles, two or more sensors 620 and 630 may be used. Operation of each of the sensors 620 and 630 may be appropriately controlled through an FPGA controller 610.

Figure 7:
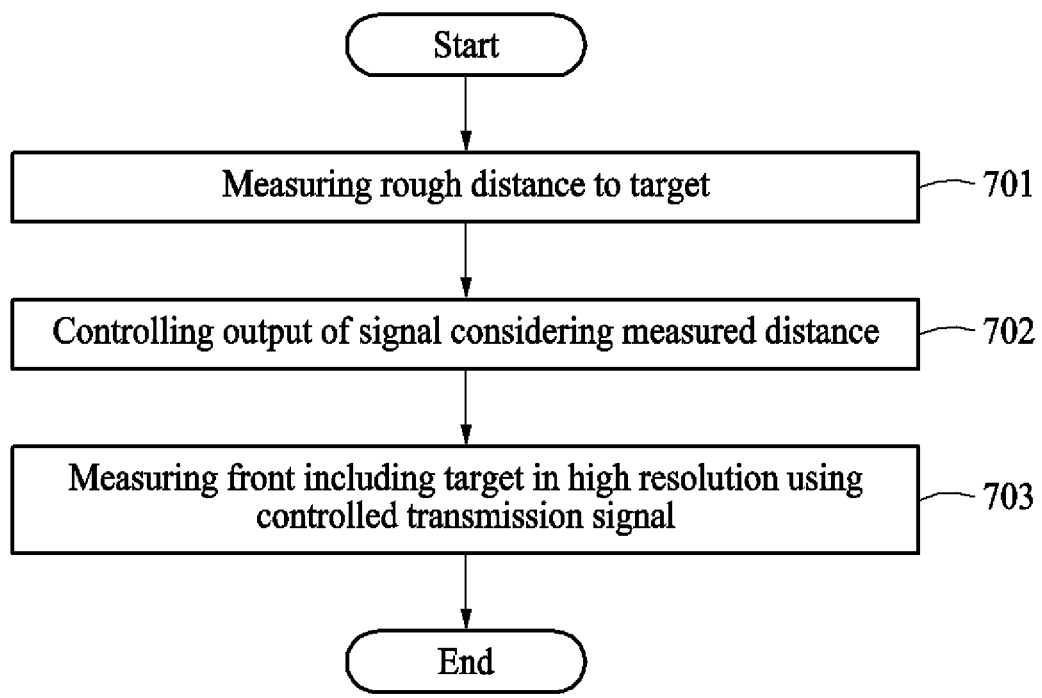
FIG. 7 is a view illustrating a method of operating a lidar sensor according to an embodiment of the present disclosure.

FIG. 7 is a view illustrating a method of operating a lidar sensor according to an embodiment of the present disclosure.

By the method of operating the lidar sensor according to an embodiment of the present disclosure, a distance to a target may be measured (step 701).

For example, the method of operating the lidar sensor according to an aspect of the present disclosure is characterized by, so as to measure a distance to the target, measuring a time until pulse-type light irradiated to the target is reflected by the target and returns, and measuring the distance based on the measured time.

Next, the method of operating the lidar sensor according to an embodiment of the present disclosure is characterized by controlling output of a transmission signal considering the measured distance (step 702).

The method of operating the lidar sensor according to an embodiment of the present disclosure is characterized by measuring a front including the target in high resolution using the controlled transmission signal (step 703).

The method of operating the lidar sensor according to an aspect of the present disclosure is characterized by, to measure a front in high resolution, measuring a phase difference between pulse-type light irradiated to the front and light reflected and returned after the irradiation and measuring the front in high resolution based on the measured phase difference.

Here, the method of operating the lidar sensor according to an aspect of the present disclosure is characterized by measuring the front at the reference interval within a threshold range based on the measured distance so as to measure the front in high resolution.

In conclusion, in accordance with the present disclosure, a distance image at a front side of a vehicle may be obtained in a high resolution using light and, particularly, the high-resolution distance image may be obtained using a small space. For example, a rough distance is measured in a direct manner and a wide viewing angle (spatial resolution) is measured in an indirect manner, thereby realizing an ideal lidar sensor. In addition, in accordance with the present disclosure, reliability of a distance image may be improved by reducing influence due to vibration of a vehicle, and vulnerability to external light may be addressed.

As apparent from the above description, in accordance with an embodiment of the present disclosure, a distance image at a front side of a vehicle may be obtained in high resolution.

In accordance with an embodiment of the present disclosure, an ideal lidar sensor may be realized by measuring a rough distance in a direct manner and measuring a wide viewing angle (spatial resolution) in an indirect manner.

In accordance with an embodiment of the present disclosure, a high-resolution distance image may be obtained using a small storage space.

In accordance with an embodiment of the present disclosure, reliability of a distance image may be increased by reducing influence due to vibration of a vehicle.

In accordance with an embodiment of the present disclosure, vulnerability to external light may be addressed.

The device described above may be implemented as a hardware component, a software component, and/or a combination of hardware components and software components. For example, the device and components described in the embodiments may be implemented using one or more general-purpose computers or special-purpose computers, such as, for example, a processor, a controller, an arithmetic logic unit (ALU), a digital signal processor, a microcomputer, a field programmable array (FPA), a programmable logic unit (PLU), a microprocessor, or any other devices capable of executing and responding to instructions. The processing device may execute an operating system (OS) and one or more software applications running on the operating system. In addition, the processing device may access, store, manipulate, process, and generate data in response to execution of the software. For ease of understanding, the processing device may be described as being used singly, but those skilled in the art will recognize that the processing device may include a plurality of processing elements and a plurality of processing element types. For example, the processing device may include a plurality of processors or one processor and one controller. Other processing configurations, such as a parallel processor, are also possible.

Software may include a computer program, code, instructions, or a combination of one or more thereof, and may configure a processing device to operate as desired or may independently or collectively command to a processing device. Software and/or data may be permanently or temporarily embodied by any machine type, a component, a physical device, virtual equipment, computer storage media, a device, or a transmitted signal wave so as to be interpreted by a processing unit or be provided to the processing unit. Software may be distributed over a networked computer system and stored or executed in a distributed manner. Software and data may be stored on one or more computer readable recording media.

Embodiments of the present invention can include a computer readable medium including program commands for executing operations implemented through various computers. The computer readable medium can store program commands, data files, data structures or combinations thereof. The program commands recorded in the medium may be specially designed and configured for the present invention or be known to those skilled in the field of computer software. Examples of a computer readable recording medium include magnetic media such as hard disks, floppy disks and magnetic tapes, optical media such as CD-ROMs and DVDs, magneto-optical media such as floptical disks, or hardware devices such as ROMs, RAMs and flash memories, which are specially configured to store and execute program commands. Examples of the program commands include a machine language code created by a compiler and a high-level language code executable by a computer using an interpreter and the like. The hardware devices may be configured to operate as one or more software modules to perform the operations of the embodiments, and vice versa.

Although the present invention has been described through limited embodiments and figures, the present invention is not intended to be limited to the embodiments. Those skilled in the art will appreciate that various modifications, additions and substitutions are possible, without departing from the scope and spirit of the invention. For example, although the described techniques are performed in a different order from the described method, and/or constituents, such as the described systems, structures, devices, and circuits, are combined in different manners and forms from the described method or substituted or replaced by other constituents or equivalents, appropriate results can be achieved.

It should be understood, therefore, that there is no intent to limit the invention to the embodiments disclosed, rather, the invention is to cover all modifications, equivalents, and alternatives falling within the spirit and scope of the invention as defined by the claims.

What is claimed is:
1. A lidar sensor using a direct manner and an indirect manner of Time-of-Flight (TOF) technology, comprising:
   a first sensor of the direct manner configured to measure a coarse distance to a target by irradiating the target with pulse-type light and measuring a time until the irradiated light is reflected by the target and returns; and a second sensor of the indirect manner configured to measure a fine distance by measuring a phase difference between the pulse-type light irradiated to a front of a vehicle and the light reflected and returned after the irradiation within a threshold range based on the coarse distance measured by the first sensor, the front comprising the target, wherein the first sensor comprises at least one light receiving element of an Avalanche Photodiode (APD) and a Single Photon Avalanche Diode (SPAD).

2. The lidar sensor according to claim 1, wherein a ratio of the number of the second sensors to the number of the first sensor is 5 to 20.

3. The lidar sensor according to claim 1, further comprising a controller configured to control at least one of an order, a ratio, and an operation of the coarse distance measured using the first sensor and the fine distance measured using the second sensor through a software.

4. A lidar sensor, comprising:
a first pixel of a direct manner configured to measure a coarse distance to a target by irradiating the target with pulse-type light and measuring a time until the irradiated light is reflected by the target and returns;
a controller configured to control output of a transmission signal considering the measured distance; and
a plurality of second pixels of an indirect manner configured to measure a fine distance by measuring a phase difference between the pulse-type light irradiated to a front of a vehicle and the light reflected and returned after the irradiation, within a threshold range based on the coarse distance measured by the first pixel and configured to measure the front comprising the target in high resolution using the controlled transmission signal, wherein the first pixel measures the coarse distance to the target using at least one light receiving element of an Avalanche Photodiode (APD) and a Single Photon Avalanche Diode (SPAD).

5. The lidar sensor according to claim 4, wherein the second pixels comprise a drain node, and the controller turns on the drain node to remove electrons generated by external light when the transmission signal is not turned on by the external light.

6. The lidar sensor according to claim 4, wherein a ratio of the number of the second sensors to the number of the first sensor is 5 to 20.

7. A method of operating the lidar sensor according to claim 1, the method comprising:
measuring a distance to the target;
controlling output of a transmission signal considering the measured distance; and
measuring the front comprising the target in high resolution using the controlled transmission signal.

* * * * *